US012642113B2

(12) United States Patent
Lee et al.

(10) Patent No.: US 12,642,113 B2
(45) Date of Patent: May 26, 2026

(54) ELECTRONIC APPARATUS FOR PERFORMING A CONNECTION RESISTANCE TEST

(71) Applicant: Samsung Display Co., Ltd., Yongin-si (KR)

(72) Inventors: Kyung-Mok Lee, Yongin-si (KR); Dong-Youb Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 439 days.

(21) Appl. No.: 18/321,103

(22) Filed: May 22, 2023

(65) Prior Publication Data

US 2024/0030123 A1      Jan. 25, 2024

(30) Foreign Application Priority Data

Jul. 19, 2022      (KR) ......................... 10-2022-0089089

(51) Int. Cl.
H10W 70/65      (2026.01)
G01R 27/20      (2006.01)
(Continued)

(52) U.S. Cl.
CPC .......... H10W 70/65 (2026.01); G01R 27/205 (2013.01); H10W 70/611 (2026.01); H10W 70/688 (2026.01); H10W 72/07352 (2026.01); H10W 72/327 (2026.01); H10W 72/9415 (2026.01); H10W 72/9445 (2026.01); H10W 90/732 (2026.01); H10W 90/734 (2026.01)

(58) Field of Classification Search
CPC ... H01L 23/49838; H01L 24/05; H01L 24/06; H01L 24/32; H01L 24/33; H01L 23/5386; H01L 23/5387; H01L 2224/05568; H01L 2224/0612; H01L 2224/0613; H01L 2224/32148; H01L 2224/32238; H01L 2224/3303; G01R 27/205; H05K 1/117; H05K 1/0268
USPC ....................................................... 257/737
See application file for complete search history.

(56) References Cited

U.S. PATENT DOCUMENTS

| | | | |
|---|---|---|---|
| 10,546,909 B2 | 1/2020 | Lee et al. | |
| 2006/0284821 A1* | 12/2006 | Takenaka ............... | G09G 3/006 |
| | | | 345/100 |

(Continued)

FOREIGN PATENT DOCUMENTS

| | | | | | |
|---|---|---|---|---|---|
| CN | 111261055 A | * | 6/2020 | ............... | G09F 9/33 |
| KR | 20040057692 A | * | 7/2004 | ......... | G02F 1/13458 |

(Continued)

*Primary Examiner* — Lex H Malsawma
*Assistant Examiner* — Laura M Dykes
(74) *Attorney, Agent, or Firm* — Lerner David LLP

(57) ABSTRACT

An electronic apparatus includes an electronic panel including a first pad part and a second pad part having a portion electrically connected to the first pad part, a driving circuit including a bump part overlapping the first pad part in a plan view, and a circuit board including a lead part overlapping the second pad part in a plan view. The lead part including a plurality of test leads includes a first test lead group electrically connected to the first pad part, and a second test lead group insulated from the first pad part, and one test lead of the first test lead group and one test lead of the second test lead group are electrically connected to each other.

19 Claims, 11 Drawing Sheets

(51) Int. Cl.

| | | |
|---|---|---|
| *H10W 70/60* | (2026.01) | |
| *H10W 70/67* | (2026.01) | |
| *H10W 72/00* | (2026.01) | |
| *H10W 72/30* | (2026.01) | |
| *H10W 72/90* | (2026.01) | |
| *H10W 90/00* | (2026.01) | |

(56) References Cited

U.S. PATENT DOCUMENTS

| | | |
|---|---|---|
| 2011/0169792 A1 | 7/2011 | Shimizu et al. |
| 2022/0087026 A1 | 3/2022 | Park et al. |

FOREIGN PATENT DOCUMENTS

| | | |
|---|---|---|
| KR | 10-2018-0110710 | 10/2018 |
| KR | 10-2022-0034986 | 3/2022 |

* cited by examiner

ELECTRONIC APPARATUS FOR PERFORMING A CONNECTION RESISTANCE TEST

CROSS-REFERENCE TO RELATED APPLICATION(S)

This application claims priority to and benefits of Korean Patent Application No. 10-2022-0089089 under 35 U.S.C. § 119, filed on Jul. 19, 2022, in the Korean Intellectual Property Office KIPO), the entire contents of which are incorporated herein by reference.

BACKGROUND

1. Technical Field

The disclosure herein relates to an electronic apparatus for performing a connection resistance test.

2. Description of the Related Art

An integrated circuit for driving light-emitting devices in an electronic apparatus may be mounted on an electronic panel. In recent years, there is a tendency to adopt, for various applications, a chip-on glass (COG) method and a chip-on plastic (COP) method, in which an integrated circuit is directly mounted on an electronic panel, because the COG or COP method may ensure a simplified structure and increase the proportion of a display area in the electronic panel.

In case that an integrated circuit is directly mounted on an electronic panel through a COG method, a connection resistance occurs between the electronic panel and the integrated circuit. In case that the connection resistance is increased, the performance of the electronic panel may deteriorate. Accordingly, in order to conform the performance of the electronic panel, the connection resistance has to be measured after the electronic panel is manufactured.

SUMMARY

The disclosure provides an electronic apparatus capable of reducing number of terminals for measuring a connection resistance of an electronic panel.

The disclosure also provides an electronic apparatus in which connection resistances can be measured at multiple points using fewer terminals.

The disclosure also provides an electronic apparatus with reduced size of a circuit board by reducing the area occupied by terminals in the circuit board.

An embodiment of the disclosure provides an electronic apparatus that may include an electronic panel including a first pad part and a second pad part having a portion electrically connected to the first pad part, a driving circuit including a bump part overlapping the first pad part in a plan view, and a circuit board including a lead part overlapping the second pad part in a plan view. The lead part including a plurality of test leads may include a first test lead group electrically connected to the first pad part, and a second test lead group insulated from the first pad part. One test lead of the first test lead group and one test lead of the second test lead group may be electrically connected to each other.

In an embodiment, the circuit board may further include a plurality of terminals electrically connected to the plurality of test leads. The plurality of terminals may include a first terminal receiving a ground voltage. The one test lead of the first test lead group and the one test lead of the second test lead group may be electrically connected to the first terminal.

In an embodiment, the plurality of terminals may further include a second terminal electrically connected to each of the one test lead of the first test lead group and the one test lead of the second test lead group.

In an embodiment, the plurality of terminals may be disposed along a periphery of the circuit board.

In an embodiment, the plurality of terminals may be disposed adjacent to an end of the electronic panel.

In an embodiment, the electronic apparatus may further include a conductive adhesive member electrically connecting the electronic panel and the driving circuit or the electronic panel and the circuit board.

In an embodiment, the first pad part may include N first test pads, the second pad part may include N second test pads and N third test pads, the bump part may include N test bumps, the first test lead group and the second test lead group may each include N test leads, and N may be a natural number greater than or equal to 3.

In an embodiment, the N second test pads and the N first test pads may be electrically connected to each other.

In an embodiment, at least one of the N first test pads or the N third test pads may include a dummy pad.

In an embodiment, N may be 3, the N first test pads may include at least one dummy pad, and the N third test pads may include at least one dummy pad.

In an embodiment, the electronic panel may include a base substrate in which a display area, a first area, and a second area spaced apart from each other are defined, and a plurality of pixels disposed in the display area, the first pad part may include a plurality of first effective pads disposed in the first area and electrically connected to the plurality of pixels, and a plurality of first test pads insulated from the plurality of first effective pads, the second pad part may include a plurality of second effective pads disposed in the second area and electrically connected to the plurality of first effective pads, a plurality of second test pads electrically connected to the plurality of first test pads, and a plurality of third test pads insulated from the plurality of first test pads, and the bump part may include a plurality of effective bumps electrically connected to the plurality of first effective pads, and a plurality of test bumps electrically connected to the plurality of first test pads.

In an embodiment, the lead part may further include a plurality of effective leads electrically connected to the plurality of second effective pads, the first test lead group may be electrically connected to the plurality of second test pads, and the second test lead group may be electrically connected to the plurality of third test pads.

In an embodiment, the circuit board may include a plurality of terminals electrically connected to the plurality of test leads, the plurality of terminals may include a first terminal receiving a ground voltage, and the one test lead of the first test lead group and the one test lead of the second test lead group may be electrically connected to the first terminal.

In an embodiment, the plurality of terminals may further include a second terminal electrically connected to the one test lead of the first test lead group and the one test lead of the second test lead group.

In an embodiment, the electronic panel may be made of a glass or a plastic.

In an embodiment, the circuit board may be a printed circuit board (PCB) or a flexible-printed circuit board (FPCB).

In an embodiment of the disclosure, an electronic apparatus may include an electronic panel including a first pad part and a second pad part having a portion electrically connected to the first pad part, a driving circuit including a bump part overlapping the first pad part in a plan view, and a circuit board including a lead part overlapping the second pad part in a plan view. The lead part including a plurality of test leads may include a first test lead group and a third test lead group which are electrically connected to the first pad part and spaced apart from each other, and a second test lead group and a fourth test lead group which are insulated from the first pad part and spaced apart from each other. One test lead of the second test lead group and one test lead of the fourth test lead group may be electrically connected to each other.

In an embodiment, the electronic apparatus may further include a plurality of terminals electrically connected to the plurality of test leads. The plurality of terminals may include a first terminal receiving a ground voltage, and the one test lead of the second test lead group and the one test lead of the fourth test lead group may be electrically connected to the first terminal.

In an embodiment, one test lead of the first test lead group and one test lead of the third test lead group may be electrically connected to each other.

In an embodiment, the one test lead of the first test lead group and the one test lead of the third test lead group may be electrically connected to the first terminal.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain principles of the disclosure. In the drawings.

DETAILED DESCRIPTION OF THE EMBODIMENTS

Figure 1:
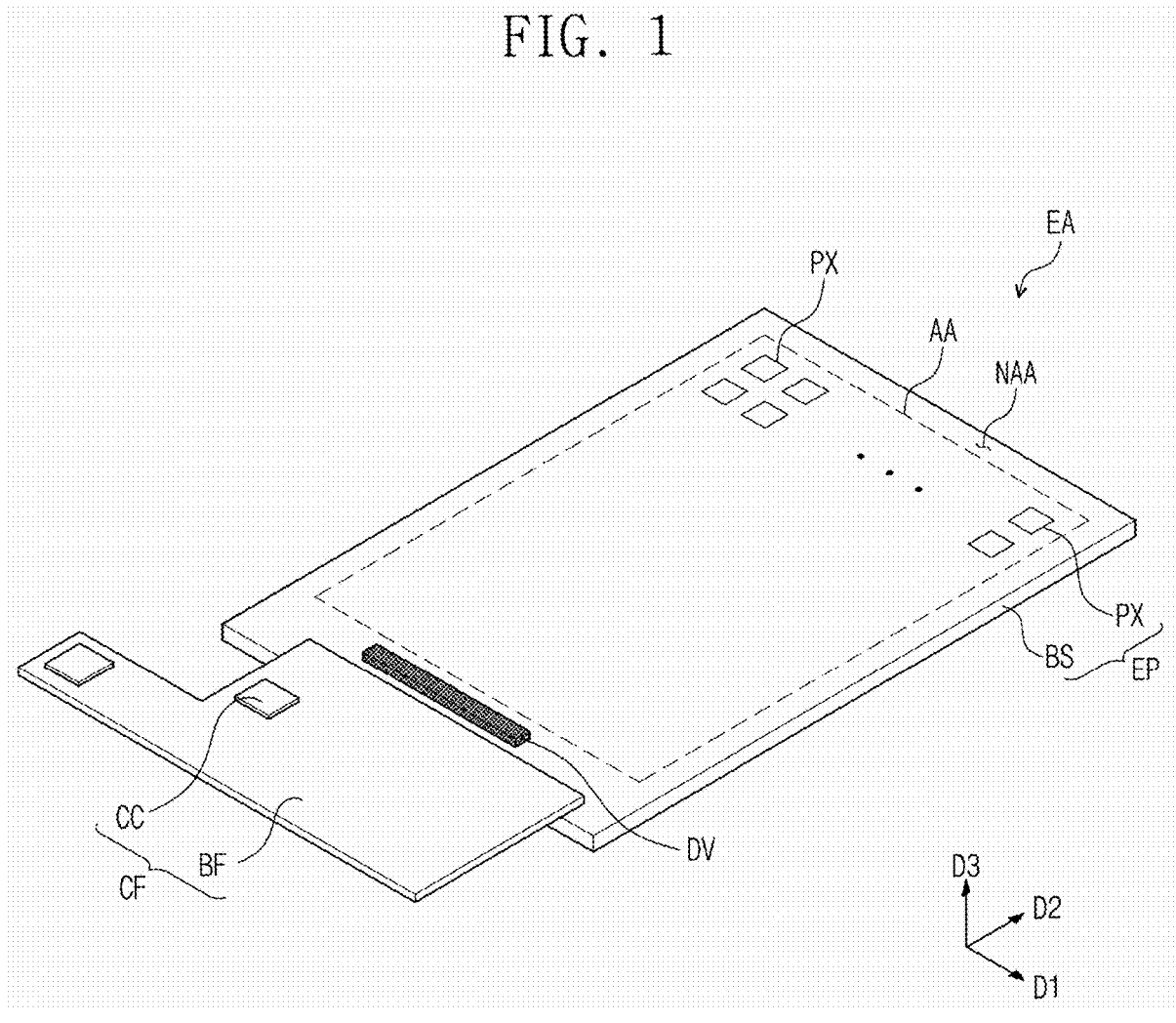
FIG. 1 is a perspective view of an electronic apparatus according to an embodiment of the disclosure.

It will be understood that when an element (or region, layer, part, etc.) is referred to as being "on", "connected to" or "coupled to" another element, it can be directly on, connected or coupled to the other element or intervening elements may be present. To this end, the term "connected" may refer to physical, electrical, and/or fluid connection, with or without intervening elements.

Like numbers refer to like elements throughout. The thickness, ratio and dimension of the element in the figures are exaggerated for effective description of the technical contents. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer, or section discussed below could be termed a second element, component, region, layer or section without departing from the teachings of the disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the figures. These terms are relative concepts, and described with respect to the direction shown in the figures.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined, all terms (including technical and scientific terms) used herein have the same meaning as commonly understood by one of ordinary skill in the art to which the disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the disclosure will be explained in detail with reference to the accompanying drawings.

FIG. 1 is a perspective view of an electronic apparatus according to an embodiment of the disclosure.

Referring to FIG. 1, an electronic apparatus EA may include an electronic panel EP, a circuit board CF, a driving chip CC, and a conductive adhesive member AF and AF'. The electronic panel EP may display an image on a front surface. The front surface may be parallel to a first direction D1 and a second direction D2 and may be perpendicular to a third direction D3. The front surface may be divided into an active region AA where an image is displayed and a peripheral region NAA disposed adjacent to the active region AA. In the embodiment, the peripheral region NAA may have a frame shape surrounding the edge of the active region AA. However, this is shown as an exception, and the peripheral region NAA may be defined adjacent to a portion of the edge of the active region AA, and the shape of the peripheral region NAA is not limited to any one embodiment of the disclosure.

The electronic panel EP may sense external pressure. For example, the electronic panel EP may include sensors disposed in the active region AA and sense the position or intensity of an external input applied to the active region AA. The sensors may be driven in a capacitive manner, a pressure-sensitive manner, or in various manners, and the external input may be provided in various forms, such as a user's hand, an electromagnetic pen, light, or heat. However, in this embodiment, an electronic panel EP displaying an image will be described for convenience of explanation.

The electronic panel EP may include a base substrate BS and multiple pixels PX. In the embodiment, each of the pixels PX may receive electrical signals, and may display light constituting an image. The pixels PX are illustrated to respectively correspond to light-emitting regions each displaying light. Accordingly, it is illustrated that the pixels PX are disposed in the active region AA and are spaced apart from each other. However, the disclosure is not limited thereto, and some of the components constituting each of the pixels PX may be disposed in the peripheral region NAA or disposed overlapping the components of adjacent pixels in a plan view. The arrangement of the pixels is not limited to any one embodiment.

The electronic panel EP may be made of glass or plastic.

The pixels PX may each include at least one transistor and a display device.

The circuit board CF may be disposed on a side of the electronic panel EP and may be electrically connected to the electronic panel EP. The circuit board CF may generate an electrical signal and provide the electrical signal to the electronic panel EP, or may receive and process an electrical signal generated from the electronic panel EP.

Electrical signals generated by the circuit board CF may be provided to each of the pixels PX through signal lines SL of the electronic panel EP. The signal lines SL may be electrically connected to the pixels PX. In case that the electronic panel EP senses the external input, some of the signal lines SL may be electrically connected to sensors. The circuit board CF according to an embodiment of the disclosure may include various embodiments as long as the circuit board is electrically connected to the electronic panel EP, and is not limited to any one embodiment.

The circuit board CF may include a base film BF and the driving chip CC. The base film BF may be attached (e.g., directly attached) to the electronic panel EP through conductive adhesive members AF and AF'. The circuit board CF may be a printed circuit board (PCB) or a flexible-printed circuit board (FPCB).

The driving chip CC may be mounted on the base film BF through a chip-on-film method. The driving chip CC may be electrically connected with the base film BF through circuit wires included in the base film BF. The base film BF may electrically connect the driving chip CC and the electronic panel EP, and the driving chip CC may generate an electrical signal to provide the electrical signal to the electronic panel EP or may process an electrical signal provided from the electronic panel EP.

The driving chip CC may include a gate control circuit that generates gate signals or a data control circuit that generates data signals. However, this is illustrated as an example, and the driving chip CC may include various control circuits which generate and process various control signals for driving the electronic panel EP, and is not limited to any one embodiment.

The conductive adhesive member AF may be disposed between the circuit board CF and the electronic panel EP to couple the circuit board CF and the electronic panel EP. The conductive adhesive member AF' may be disposed between the driving circuit DV and the electronic panel EP to couple the driving circuit DV and the electronic panel EP. The conductive adhesive members AF and AF' may have both conductivity and adhesiveness. Accordingly, the conductive adhesive members AF and AF' may physically and electrically couple the circuit board CF and the electronic panel EP. The conductive adhesive members AF and AF' may each include an anisotropic conductive adhesive film (ACF).

The conductive adhesive members AF and AF' may be provided in a shape extending in the first direction D1. A portion of the conductive adhesive members AF and AF' may protrude to the outside of the base film BF. For example, a length in the first direction D1 of the conductive adhesive members AF and AF' on the electronic panel EP may be greater than or equal to a width in the first direction D1 of the base film BF. Accordingly, the ends of the conductive adhesive members AF and AF' may be aligned with the corner of the base film BF, or a portion of the conductive adhesive members AF and AF' may be exposed from the base film BF.

For example, the conductive adhesive members AF and AF' each may have a length extending in the first direction D1 and a width extending in the second direction D2. The lengths of the conductive adhesive members AF and AF' may be provided to cover the first pad part PD1 or the second pad part PD2. The widths of the conductive adhesive members AF and AF' may entirely cover at least the first effective pads PD1-$a$ and the second effective pads PD2-$a$, thereby improving the electrical connection reliability between the driving circuit DV and the electronic panel EP or between the circuit board CF and the electronic panel EP.

The driving circuit DV may be electrically connected to the electronic panel EP, for example, the pixels PX. For example, the driving circuit DV may include a data driving circuit DV, which provides data signals to the pixels PX. However, this is described as an example, and the driving circuit DV may include various driving circuits DV such as a gate driving circuit DV, a light emission control circuit, and a power generating circuit as long as the driving circuit may provide electrical signals to the pixels PX, and is not limited to any one embodiment.

In the embodiment, the driving circuit DV may be mounted on the electronic panel EP through a chip-on-panel method. The conductive adhesive members AF and AF' may be disposed between the driving circuit DV and the electronic panel EP and couple the driving circuit DV and the electronic panel EP. However, this is illustrated by way of example, and the driving circuit DV may be formed through the same process as that for the pixels PX, for example, a low-temperature silicon process and constitute the electronic panel EP, and is not limited to any one embodiment. Also, in an embodiment of the disclosure, the driving circuit DV may be disposed in a region between the active region AA and the circuit board CF, or may be omitted.

Figure 2A:
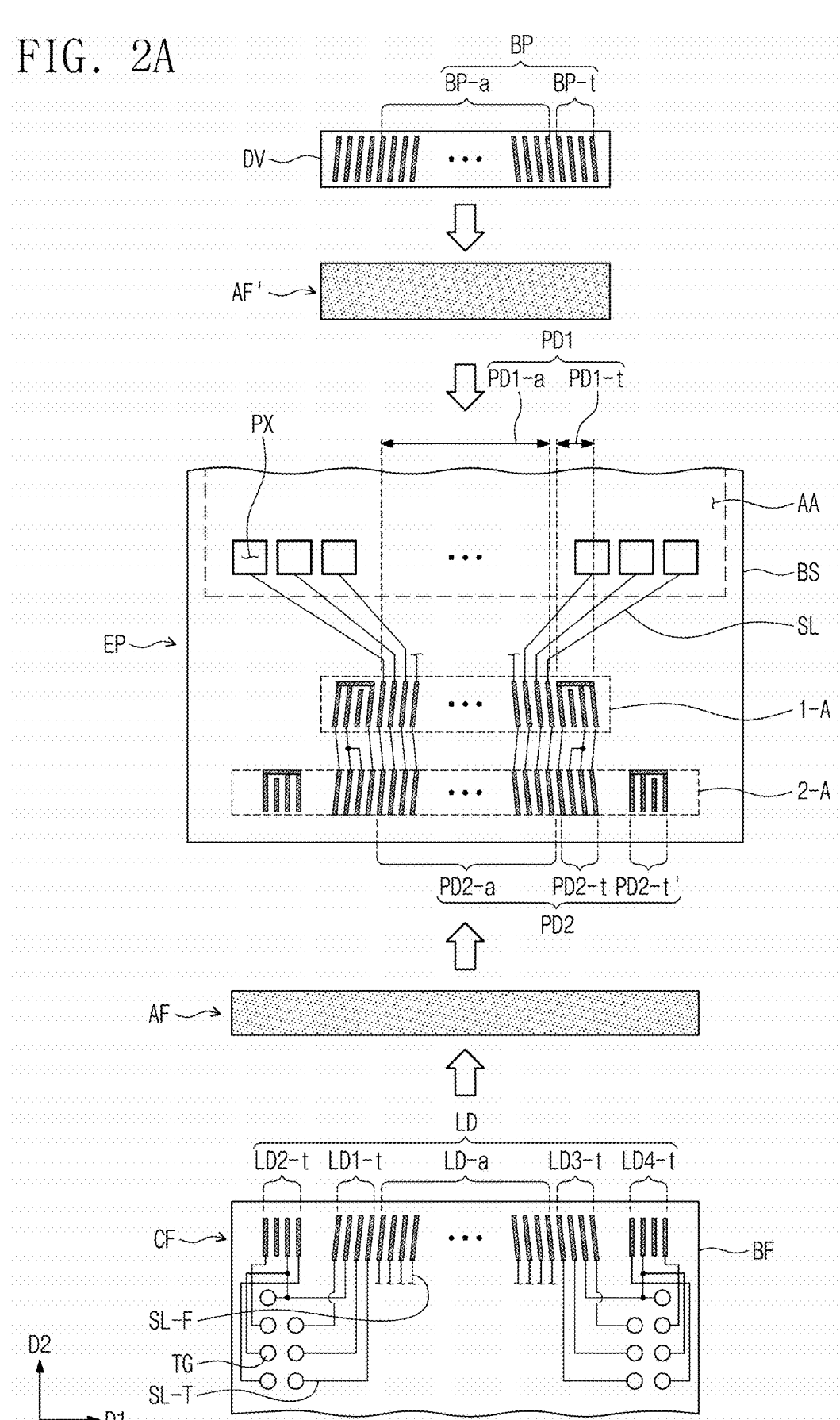
FIG. 2A is an exploded plan view of an electronic apparatus according to an embodiment of the disclosure.
Figure 2B:
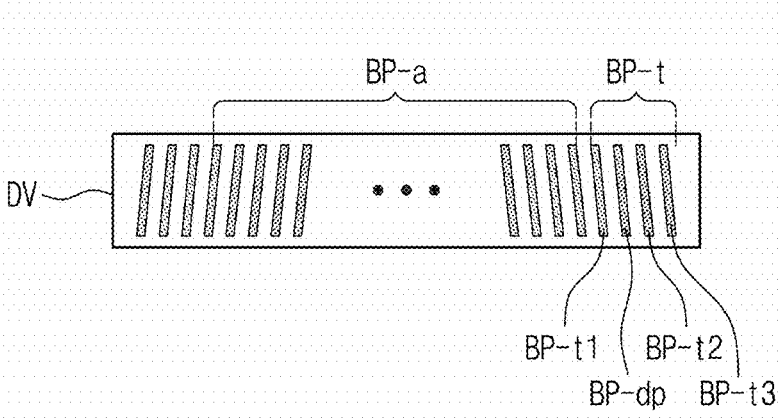
FIG. 2B is an enlarged plan view of a driving circuit in FIG. 2A.
Figure 2C:
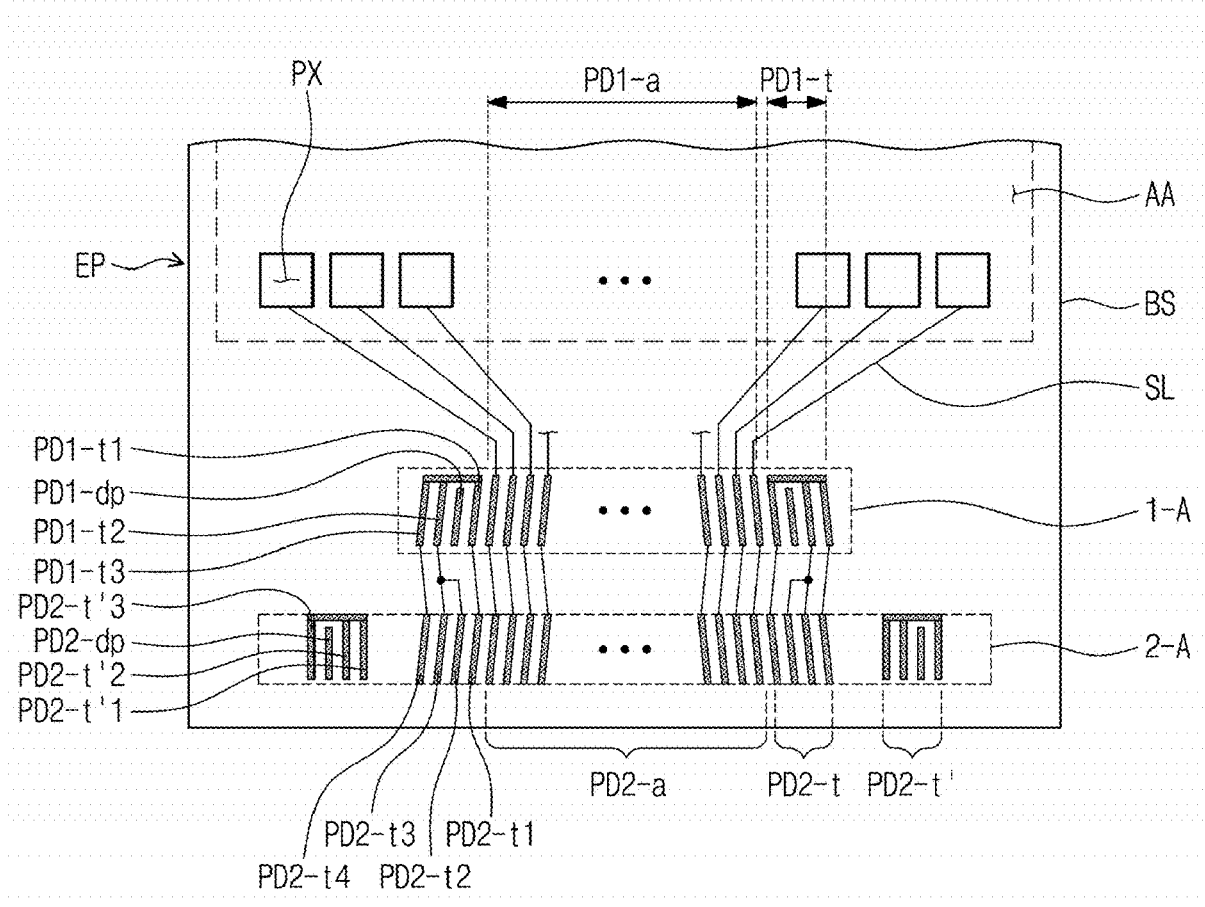
FIG. 2C is an enlarged plan view of a part of an electric panel in FIG. 2A.
Figure 2D:
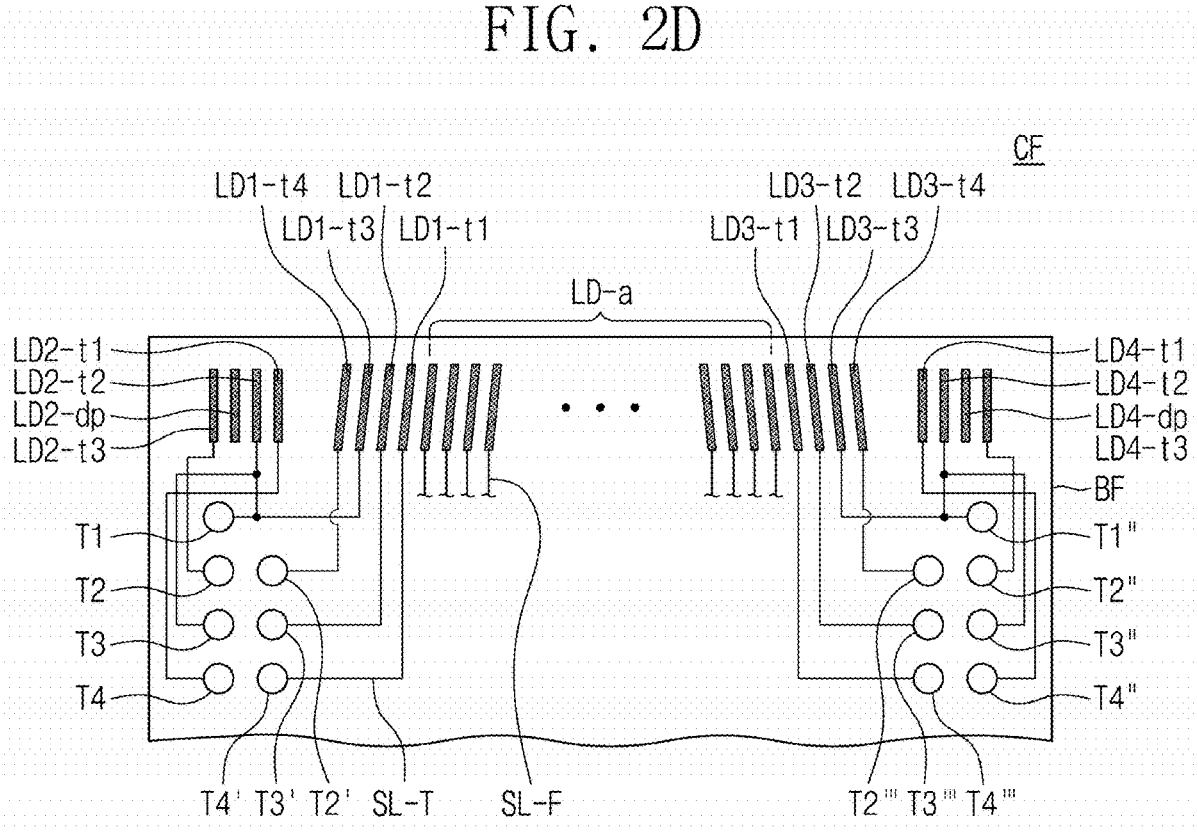
FIG. 2D is an enlarged plan view of a circuit board in FIG. 2A.
Figure 3:
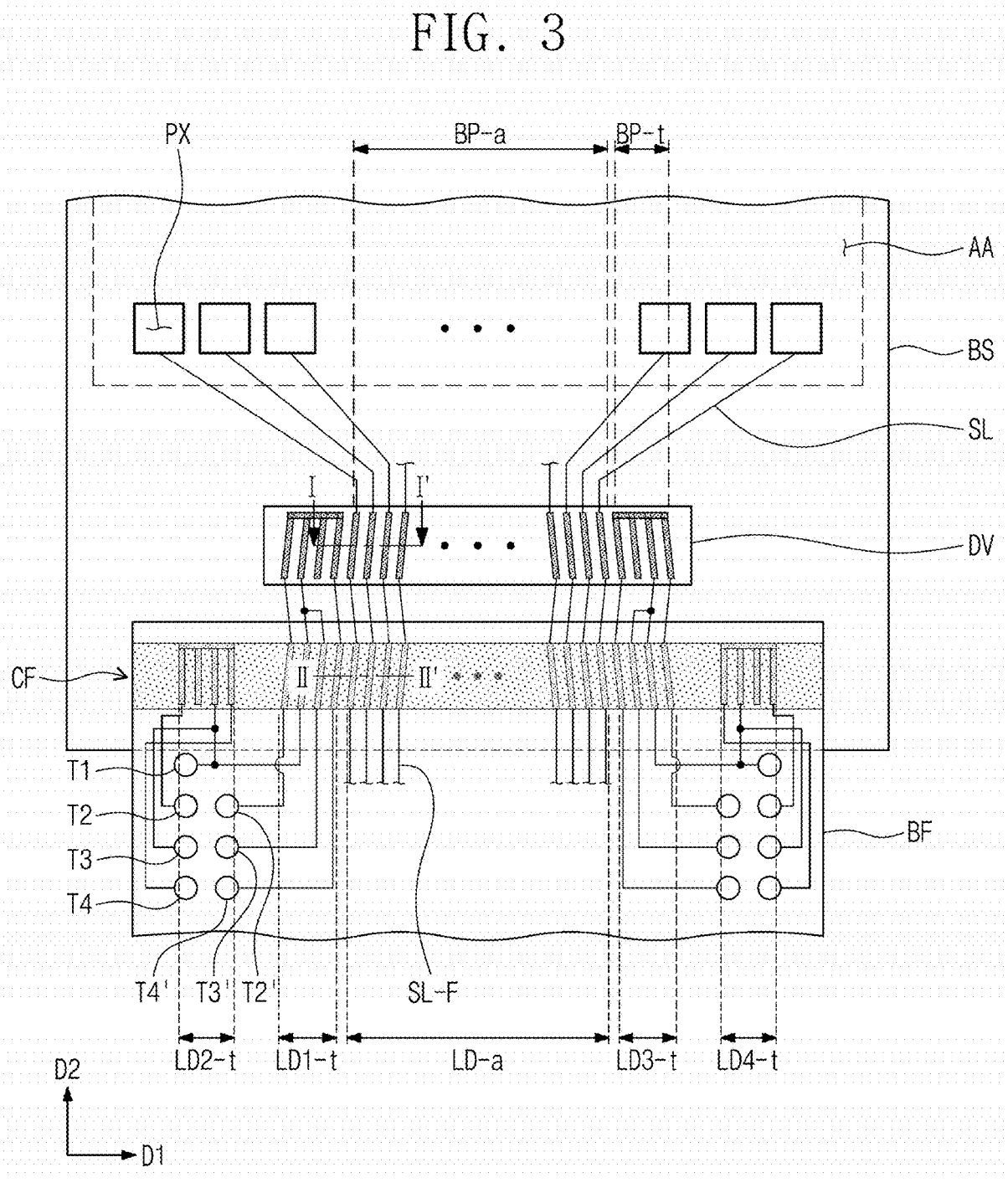
FIG. 3 is a combined plan view of an electronic apparatus according to an embodiment of the disclosure.

FIG. 2A is an exploded plan view of an electronic apparatus according to an embodiment of the disclosure, FIG. 2B is an enlarged plan view of a driving circuit of FIG. 2A, FIG. 2C is an enlarged plan view of a part of an electronic panel of FIG. 2A, FIG. 2D is an enlarged plan view of a circuit board of FIG. 2A, and FIG. 3 is a combined plan view of an electronic apparatus according to an embodiment of the disclosure.

Referring to FIG. 2A, an electronic panel EP may include a base substrate BS, pixels PX, signal lines SL, and pads.

The base substrate BS may include an active region AA and a peripheral region NAA, and may be a base layer on which pixels PX, signal lines SL, a first pad part PD1, and a second pad part PD2 are formed. The base substrate BS may have insulation property. On the other hand, each of the first pad part PD1 and the second pad part PD2 may have conductivity.

In the embodiment, only some of the pixels PX, some of the signal lines SL, a portion of the first pad part PD1, and a portion of the second pad part PD2 are illustrated for convenience of explanation.

The first pad part PD1 may be disposed in a first area 1-A of the peripheral region NAA, and the second pad part PD2 may be disposed in a second area 2-A of the peripheral region NAA. The driving circuit DV, which will be described later, may overlap the first area 1-A in a plan view, and the circuit board CF may overlap the second area 2-A in a plan view.

The first pad part PD1 may include multiple first effective pads PD1-$a$ and multiple first test pads PD1-$t$. The second pad part PD2 may include multiple second effective pads PD2-$a$, multiple second test pads PD2-$t$, and multiple third test pads PD2-$t'$.

In an embodiment of the disclosure, heat or the like generated during a process of connection between the circuit board CF and the electronic panel EP may cause the base film BF of the circuit board CF or the base board BS of the electronic panel EP to be thermally deformed. Accordingly, pitches of the pads of the first pad part PD1 and the second pad part PD2 may be changed differently from designed pitches during the manufacturing process.

According to an embodiment of the disclosure, the pads of the first pad part PD1 and the second pad part PD2 may be designed in a shape extending in an inclined direction. Bumps of a bump part BP and leads of a lead part LD, which will be described later, may also be designed in a shape extending in an inclined direction to have shapes corresponding to those of the first pad part PD1 and the second pad part PD2.

By designing the pads of the first pad part PD1 and the pads of the second pad part PD2 extending in an inclined direction, correction of alignment between the pads and the bumps or between the pads and the leads may be readily performed by moving the location of the driving circuit DV or the circuit board CF in the second direction D2 even in case that the pitch of the pads is changed. However, this is illustrated by way of example, and the pads of the first pad part PD1 and the second pad part PD2 may be provided in a shape extending in a direction parallel to the second direction D2, and is not limited to any one embodiment.

The first effective pads PD1-$a$ may be connected to the pixels PX through signal lines SL, and the second effective pads PD2-$a$ may be connected to the first effective pads PD1-$a$ through signal lines SL.

The signal lines SL may respectively connect the pixels PX and the first effective pads PD1-$a$ of the first pad part PD1. Accordingly, the electrical signals received from the first effective pads PD1-$a$ may be transmitted to the respective pixels PX through the signal lines SL. In the embodiment, the first effective pads PD1-$a$ may extend in a direction inclined with respect to the first direction D1 and the second direction D2. However, this is illustrated by way of example, and the first effective pads PD1-$a$ may extend in a direction parallel to the second direction D2, and the extension direction is not limited to any one embodiment. The signal lines SL may respectively connect the first effective pads PD1-$a$ of the first pad part PD1 and the second effective pads PD2-$a$ of the second pad part PD2.

The first test pads PD1-$t$ may be insulated from the first effective pads PD1-$a$. The second test pads PD2-$t$ may be insulated from the second effective pads PD2-$a$ and may be connected to the first test pads PD1-$t$. The third test pads PD2-$t'$ may be insulated from the first test pads PD1-$t$ and the second test pads PD2-$t$. In case that the circuit board CF, which will be described later, is connected to the electronic panel EP, some of the third test pads PD2-$t'$ may be connected to the second test pads PD2-$t$.

The driving circuit DV may include a bump part BP. The bump part BP may overlap the first pad part PD1 in a plan view. The bump part BP may include multiple effective bumps BP-a and multiple test bumps BP-t. The effective bumps BP-a may be connected to the first effective pads PD1-$a$, and the test bumps BP-t may be connected to the first test pads PD1-$t$. For example, the effective bump BP-a may overlap the first effective pad PD1-$a$ in a plan view, and the test bump BP-t may overlap the first test pad PD1-$t$ in a plan view.

The circuit board CF may include a base film BF, multiple wires, a lead part LD, and multiple terminals TG. The base film BF may have ductility and insulating properties. The lead part LD may include multiple leads. The wires may include signal wires SL-F for transmitting signals and test wires SL-T for testing. The lead part LD may include a first test lead group LD1-$t$, a second test lead group LD2-$t$, a third test lead group LD3-$t$, and a fourth test lead group LD4-$t$, and each of the test lead groups LD1-$t$, LD2-$t$, LD3-$t$, and LD4-$t$ may include multiple test leads. Also, the test leads may be respectively connected to the terminals TG.

The effective leads LD-a and the test leads may be disposed on a surface of the base film BF. The wires may be disposed on a surface of the base film BF or inside the base film BF. The wires, the effective leads LD-a, and the test leads each may have conductivity.

The effective leads LD-a may be electrically connected to the second effective pads PD2-$a$ of the electronic panel EP. The effective leads LD-a may be spaced apart from each other in the first direction D1 to provide independent electrical signals.

Referring to FIG. 2B, the bump part BP may include multiple effective bumps BP-a and multiple test bumps BP-t.

The bump part BP may include N test bumps BP-t (N is a natural number greater than or equal to 3). For example, the test bumps BP-t may include a first bump BP-t1, a second bump BP-t2, and a third bump BP-t3 that are arranged in a direction away from the effective bump BP-a.

The test bumps BP-t may include dummy bumps. The dummy bumps may be spaced apart from the effective bumps BP-a. It is illustrated in FIG. 2B that the dummy bump BP-dp is disposed between the first bump BP-t1 and the second bump BP-t2 among the test bumps BP-t.

Referring to 2C, the first pad part PD1 may include multiple first effective pads PD1-$a$ and multiple first test pads PD1-$t$.

The first pad part PD1 may include N first test pads PD1-$t$. For example, the first test pads PD1-$t$ may include a first pad PD1-$t$1, a second pad PD1-$t$2, and a third pad PD1-$t$3 that are arranged in a direction away from the first effective pads PD1-$a$.

The first test pads PD1-$t$ may have an integral shape in which the test pads are connected to each other. In the embodiment, the first test pads PD1-$t$ may be electrically connected to each other by a connecting portion intersecting the first test pads PD1-$t$.

The first test pads PD1-$t$ may include at least one dummy pad. It is illustrated in FIG. 3C that a dummy pad PD1-$dp$ among the first test pads PD1-$t$ is disposed between the first pad PD1-$t$1 and the second pad PD1-$t$2 among the first test pads PD1-$t$.

The second pad part PD2 may include multiple second effective pads PD2-$a$, multiple second test pads PD2-$t$, and multiple third test pads PD2-$t'$.

The second pad part PD2 may include N second test pads PD2-$t$. For example, the second test pads PD2-$t$ may include a first pad PD2-$t$1, a second pad PD2-$t$2, a third pad PD2-$t$3, and a fourth pad PD2-$t$4 that are arranged in a direction away from the second effective pads PD2-$a$. The third test pads PD2-$t'$ may include a fifth pad PD2-$t'$1, a sixth pad PD2-$t'$2, and a seventh pad PD2-$t'$3 that are arranged in a direction away from the second effective pads PD2-$a$.

The third test pads PD2-$t'$ may include at least one dummy pad. It is illustrated in FIG. 3C that the dummy pad PD2-$dp$ among the third test pads PD2-$t'$ is disposed between the sixth pad PD2-$t'$2 and the seventh pad PD2-$t'$ among the second test pads PD2-$t$.

The arrangement of the dummy pads is not limited to what is illustrated in the drawings, and the dummy may be disposed between the first pad PD1-$t$1 and the second pad PD1-$t$2 in the first test pads PD1-$t$, the dummy pad may be disposed between the sixth pad PD2-$t'$2 and the seventh pad PD2-$t'$3 in the third test pads PD2-$t'$. The arrangement of the dummy pads is not limited to any one embodiment.

Referring to FIG. 2D, the circuit board CF may include multiple wires and the lead part LD.

The lead part LD may include multiple effective leads LD-a and a first test lead group LD1-$t$, a second test lead group LD2-$t$, a third test lead group LD3-$t$, and a fourth test lead group LD4-$t$ each including multiple test leads.

The wires may be disposed on a surface of the base film BF. The wires may include signal wires SL-F and test wires SL-T. An end of the signal wires SL-F may be connected to the effective lead LD-a. Another end of the signal wires SL-F may be electrically connected to a driving chip CC. Accordingly, the electrical signals processed by the driving circuit DV may be output to the pixel leads through the signal wires SL-F.

An end of the test wires SL-T may be respectively connected to the test leads. Another end of the test wires SL-T may be respectively connected to the terminals TG. Accordingly, by measuring connection resistance to be described later, it is possible to inspect whether there is a failure in connection between the first test pads PD1-$t$, the test bumps BP-t, and the test leads of the first test lead group LD1-$t$. It is also possible to inspect whether there is a failure in connection between the second test pads PD2-$t$ and the test leads of the second test lead group LD2-$t$.

Each of the first test lead group LD1-$t$ and the third test lead group LD3-$t$ may include N test leads. For example, the first test lead group LD1-$t$ and the third test lead group LD3-$t$ may respectively include first leads LD1-$t$1 and LD3-$t$1, the second leads LD1-$t$2 and LD3-$t$2, third leads LD1-$t$3 and LD3-$t$3, and fourth leads LD1-$t$4 and LD3-$t$4 that are arranged in a direction away from the effective leads LD-a.

The second test lead group LD2-$t$ and the fourth test lead group LD4-$t$ may respectively include fifth leads LD2-$t$1 and LD4-$t$1, sixth leads LD2-$t$2 and LD4-$t$2, and seventh leads LD2-$t$3 and LD4-$t$3 that are arranged in a direction away from the effective leads LD-a.

The second test lead group LD2-$t$ and the fourth test lead group LD4-$t$ may each include dummy leads. It is illustrated in FIG. 2D that each of the dummy leads LD2-$dp$ and LD4-$dp$ is disposed between the sixth leads LD2-$t$2 and LD4-$t$2 and the seventh leads LD2-$t$3 and LD4-$t$3 in the second test lead group LD2-$t$ and the fourth test lead group LD4-$t$.

The terminals may be connected to the test leads. In the first to fourth test lead groups LD4-$t$, each group may be connected to multiple terminals.

The terminals connected to each group may be four terminals, for example, a first terminal, a second terminal, a third terminal, and a fourth terminal. The first terminal among the first to fourth terminals may measure a test current or may be provided with a ground voltage. The test current may be applied to the second terminal. A test voltage may be measured at the third terminal. A test voltage may be applied to the fourth terminal.

In the first test lead group LD1-$t$, the first lead LD1-$t$1 may be connected to the fourth terminal T4', the second lead LD1-$t$2 may be connected to the third terminal T3', the third lead LD1-$t$3 may be connected to the first terminal T1, and the fourth lead LD1-$t$4 may be connected to the second terminal T2'.

In the second test lead group LD2-$t$, the fifth lead LD2-$t$1 may be connected to the fourth terminal T4, the sixth lead LD2-$t$2 may be connected to the first terminal T1 and the third terminal T3, and the seventh lead LD2-$t$3 may be connected to the second terminal T2.

In the third test lead group LD3-$t$, the first lead LD3-$t$1 may be connected to the fourth terminal T4''', the second lead LD3-$t$2 may be connected to the third terminal T3''', the third lead LD3-$t$3 may be connected to the first terminal T1'', and the fourth lead LD3-$t$4 may be connected to the second terminal T2'''.

In the fourth test lead group LD4-$t$, the fifth lead LD4-$t$1 may be connected to the fourth terminal T4'', the sixth lead LD4-$t$2 may be connected to the first terminal T1'' and the third terminal T3'', and the seventh lead LD4-$t$3 may be connected to the second terminal T2''.

However, this is illustrated by way of example, and each of the leads and each of the terminals may form various connection structures as in the embodiments that may be seen with reference to FIGS. 7 to 9, which will be described later, and are not limited to any one embodiment.

The terminals may be disposed along the periphery of the circuit board CF. Also, the terminal may be disposed to have multiple columns and rows in the first direction D1 and/or the second direction D2. The order in which the first to fourth terminals are arranged may be changed.

The terminals may be disposed along the periphery of the circuit board CF, and various structures, such as wiring, may be provided at the center of the circuit board CF, thereby increasing space utilization on the circuit board CF. The circuit board CF may be reduced in size.

However, this is illustrated by way of example, and the terminals may form various arrangement structures as in the embodiment described in FIG. 5, which will be described later, and is not limited to any one embodiment.

Referring to FIG. 3, it may be seen that the driving circuit DV and the circuit board CF are stacked on the electronic panel EP. The conductive adhesive members AF and AF' and the driving circuit DV may be sequentially stacked on the electronic panel EP in the arrow direction shown in FIG. 2A. The conductive adhesive members AF and AF' and the circuit board CF may also be sequentially stacked on the electronic panel EP in the arrow direction shown in FIG. 2A. After the driving circuit DV and the circuit board CF are aligned and provided on the conductive adhesive members AF and AF', the driving circuit DV and the circuit board CF may be bonded to the electronic panel EP by pressing.

The first effective pads PD1-$a$ and the effective bumps BP-a may be connected to each other through the conductive adhesive member AF'. Also, the second effective pads PD2-$a$ and the effective leads LD-a may be connected to each other through the conductive adhesive member AF. Similarly, the first test pads PD1-$t$ and the test bumps BP-t, and the second test pads PD2-$t$ and the test leads may be connected to each other through the conductive adhesive members AF and AF'.

For example, the first pad PD1-$t$1, the second pad PD1-$t$2, and the third pad PD1-$t$3 of the first test pads PD1-$t$ may be connected to the first bump BP-t1, the second bump BP-t2, and the third bump BP-t3 of the test bumps BP-t, respectively.

The first pad PD2-$t$1, the second pad PD2-$t$2, the third pad PD2-$t$3, and the fourth pad PD2-$t$4 of the second test pads PD2-$t$ may be respectively connected to the first leads LD1-$t$1 or LD3-$t$1, the second leads LD1-$t$2 or LD3-$t$2, the third leads LD1-$t$3 or LD3-$t$3, and the fourth leads LD1-$t$4 or LD3-$t$4 of the first test lead group LD1-$t$ or the third test lead group LD3-$t$.

The fifth pad PD2-$t$'1, the sixth pad PD2-$t$'2, and the seventh pad PD2-$t$'3 of the third test pads PD2-$t$' may be respectively connected to the fifth leads LD2-$t$1 or LD4-$t$1, the sixth leads LD2-$t$2 or LD4-$t$2, and the seventh leads LD2-$t$3 or LD4-$t$3 of the second test lead group LD2-$t$ or the fourth test lead group LD-t.

Figure 4A:
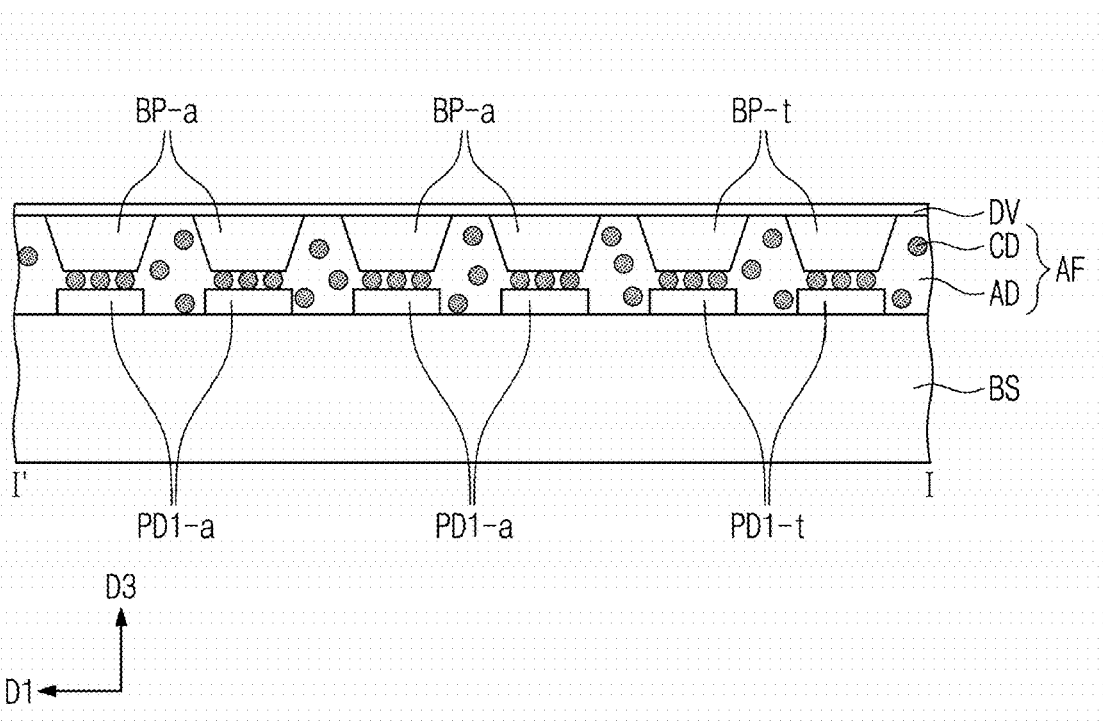
FIG. 4A is a schematic cross-sectional view taken along line I-I' illustrated in FIG. 3.
Figure 4B:
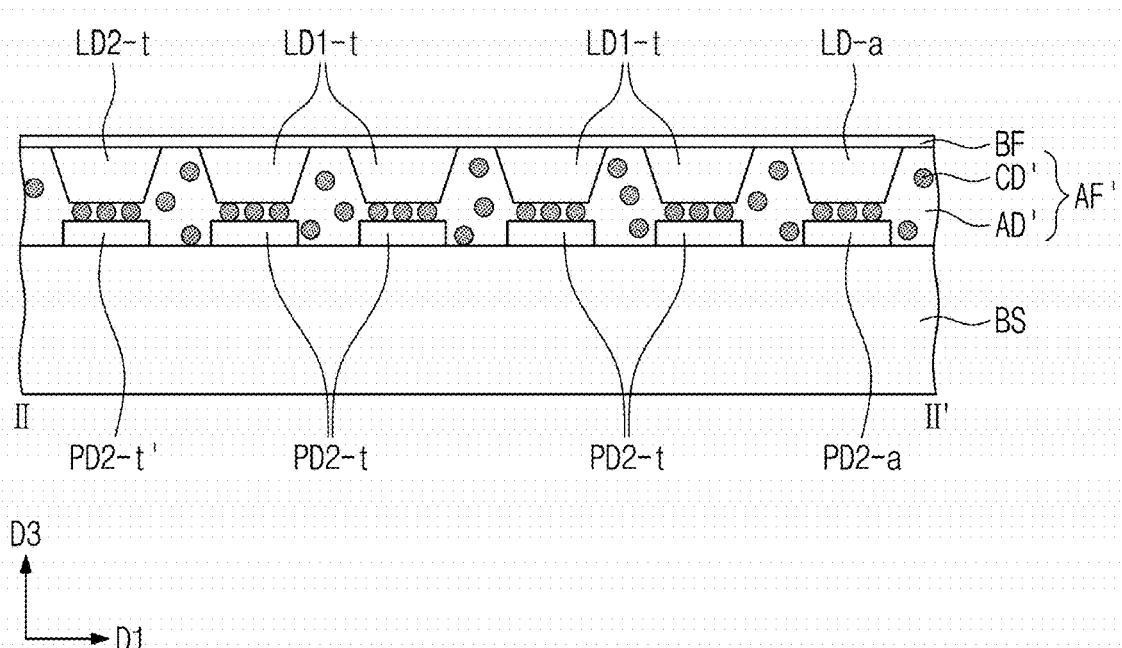
FIG. 4B is a schematic cross-sectional view taken along line II-II' illustrated in FIG. 3.

FIG. 4A is a schematic cross-sectional view taken along line I-I' shown in FIG. 3, and FIG. 4B is a schematic cross-sectional view taken along line II-II' shown in FIG. 3.

FIGS. 4A and 4B illustrates that, for convenience of explanation, the first effective pads PD1-$a$ and the second effective pads PD2-$a$ are disposed on a surface of the base substrate BS, the effective bumps BP-a are disposed on a surface of the driving circuit DV, and the effective leads LD-a are disposed on a surface of the base film BF. However, this is illustrated by way of example, and the disclosure is not limited to any one embodiment.

Referring to FIGS. 4A and 4B, in the embodiment, the conductive adhesive members AF and AF' may include adhesive layers AD and AD' and multiple conductive particles CD and CD'. The conductive particles CD and CD' may be dispersed in the adhesive layers AD and AD'. The first effective pads PD1-$a$ and the effective bumps BP-a may be physically coupled by the adhesive layer AD. The first effective pads PD1-$a$ and the effective bumps BP-a may be electrically connected through the conductive particles CD disposed therebetween. The second effective pads PD2-$a$ and the effective leads LD-a may be physically coupled by the adhesive layer AD' or electrically connected through the conductive particles CD'.

In FIGS. 4A and 4B, it is illustrated that each of the first effective pads PD1-$a$ and the effective bumps BP-a, and the second effective pads PD2-$a$ and the effective leads LD-a entirely overlap the corresponding components in a cross-sectional view. However, this is illustrated by way of example, and due to errors occurring during designing or vibrations in the first direction D1 occurring during bonding, there may be regions that the respective components partially overlap each other.

In case that the driving circuit DV and the electronic panel EP are connected, the first test pad PD1-$t$ and the test bumps BP-t may overlap each other in a plan view. In case that the circuit board CF and the electronic panel EP are connected, the second test pads PD2-$t$ and the first test lead group LD1-$t$, and the third test pads PD2-$t$' and the second test lead groups LD2-$t$ may overlap each other in a plan view, and each may be physically coupled by the adhesive layer AD and AD' and/or electrically connected through the conductive particles CD and CD'. An evaluation for a failure in connection between the electronic panel EP and the driving circuit DV and between the electronic panel EP and the circuit board CF may be performed through resistance measurement. A detailed description thereof will be provided later.

Figure 5:
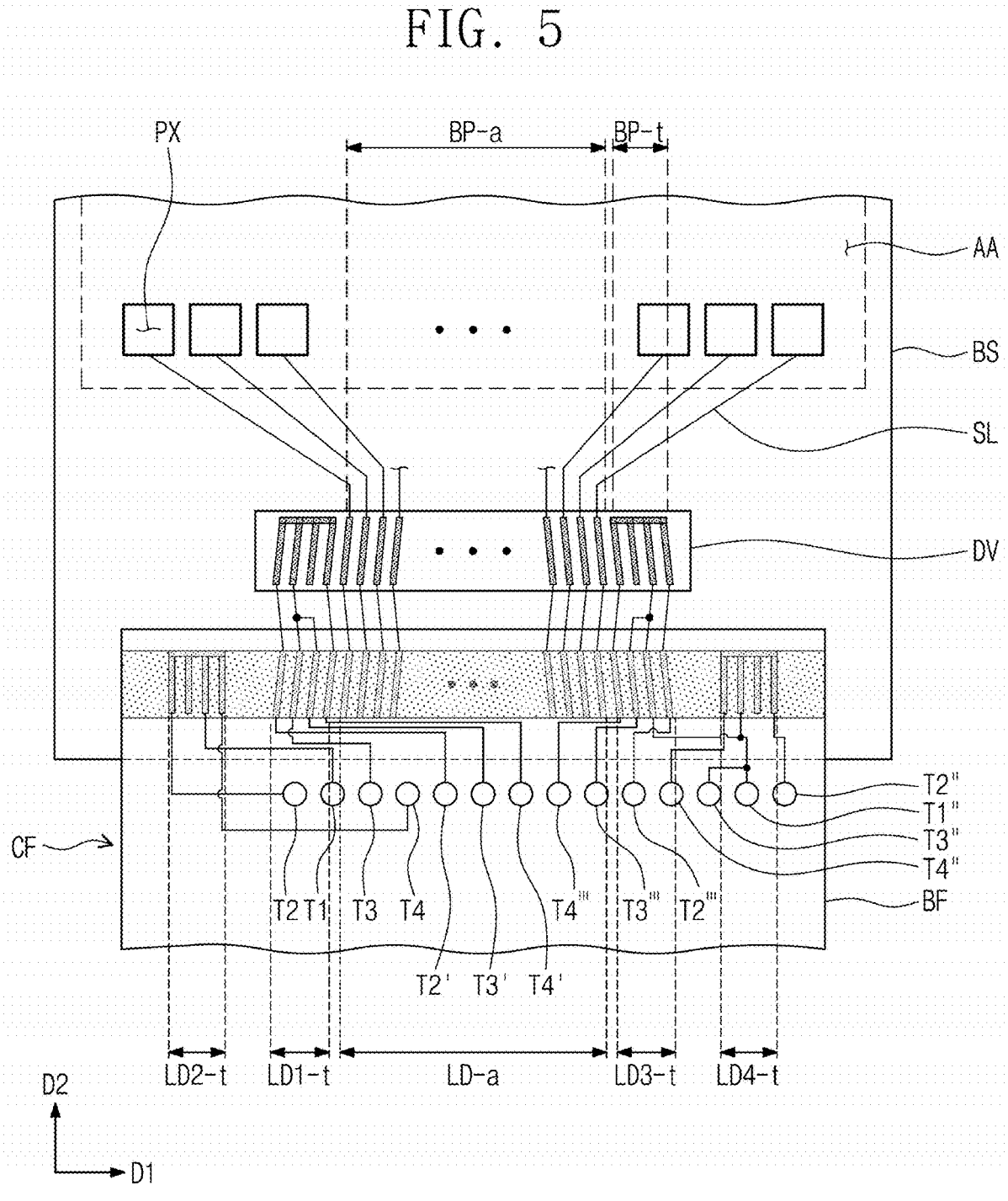
FIG. 5 is a combined plan view of an electronic apparatus according to another embodiment of the disclosure.

FIG. 5 is a combined plan view of an electronic apparatus EA according to another embodiment of the disclosure.

Referring to FIG. 5, the arrangement relationship of the terminals according to another embodiment of the disclosure is different from the arrangement of the terminals illustrated in FIG. 3.

The same reference numerals or symbols are assigned to the same components as those described with reference to FIGS. 1 to 4, and duplicated descriptions will not be given.

The terminals may be disposed adjacent to the end of the electronic panel EP on the circuit board CF. As illustrated in FIG. 5, the terminals may be disposed in a line in the first direction D1 adjacent to the end of the electronic panel EP, but the embodiment is not limited thereto and may be disposed in multiple rows.

The terminals may be disposed adjacent to the end of the electronic panel EP, and various structures, such as wirings, may be provided on the circuit board CF spaced apart from the end of the electronic panel EP by a distance, thereby increasing space utilization on the circuit board CF. The size reduction of the circuit board CF may be achieved.

Figure 6:
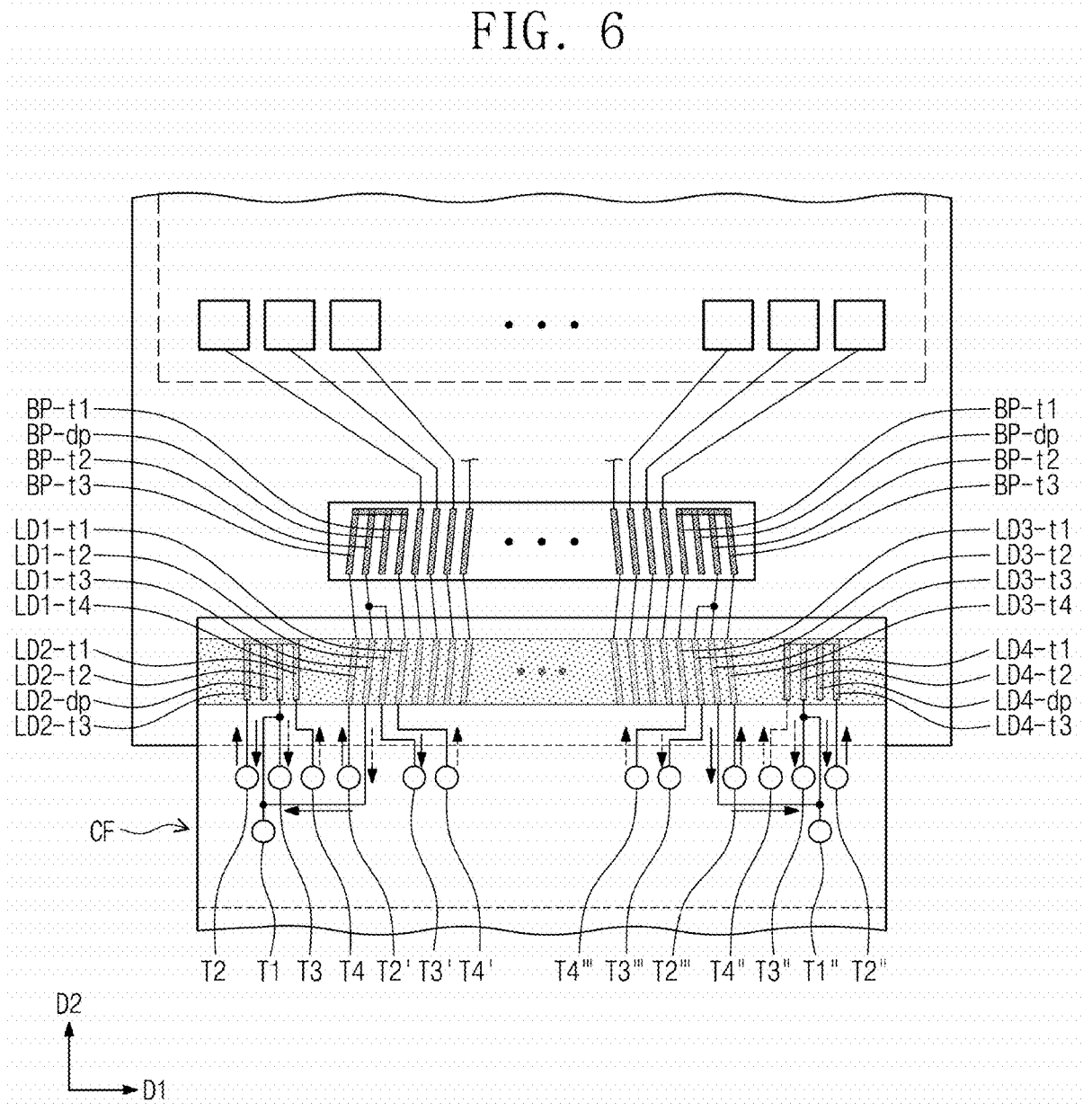
FIG. 6 is a plan view illustrating a connection structure between a lead part and terminals according to an embodiment of the disclosure.
Figure 7:
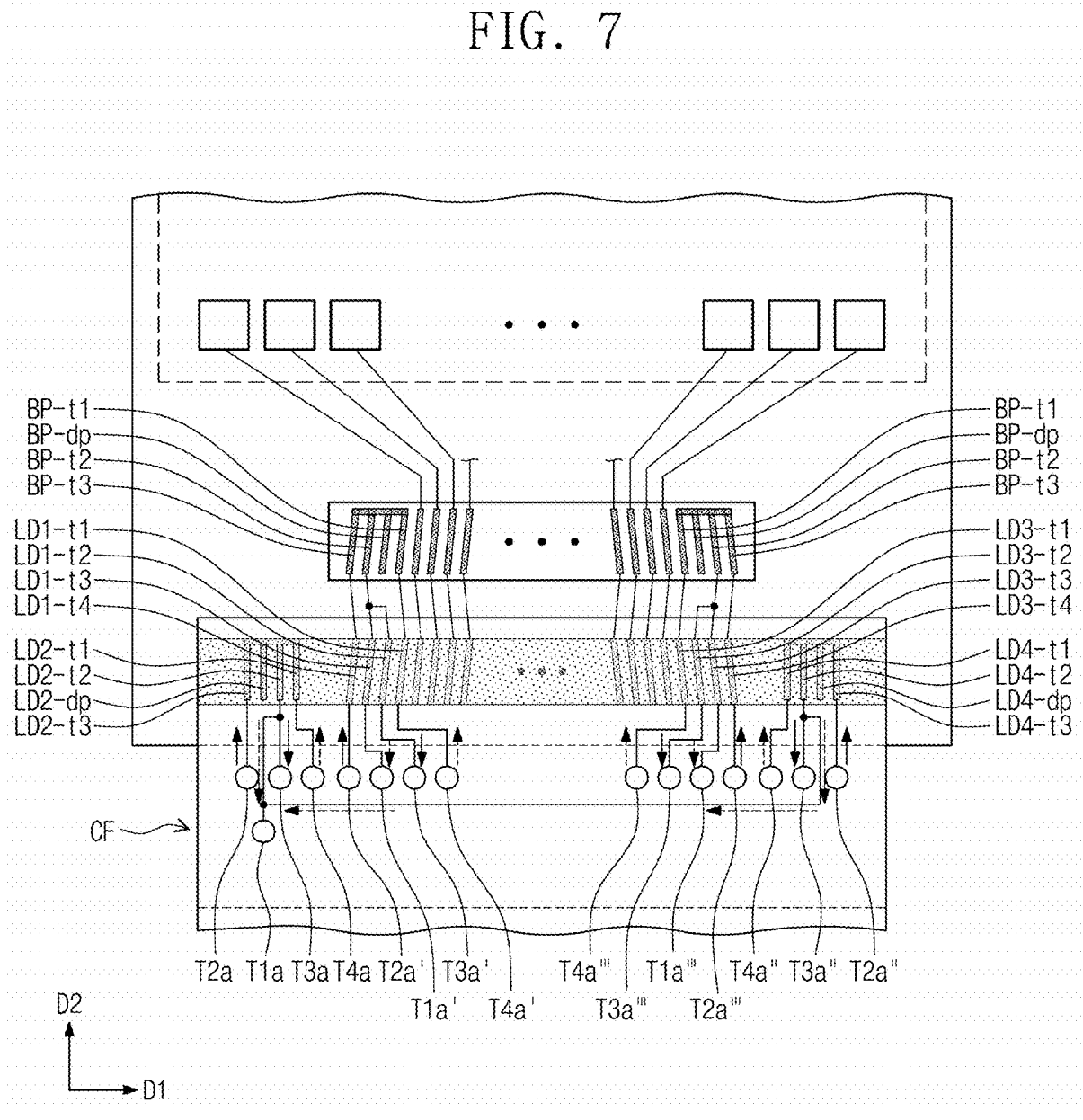
FIG. 7 is a plan view illustrating a connection structure between a lead part and terminals according to an embodiment of the disclosure.
Figure 8:
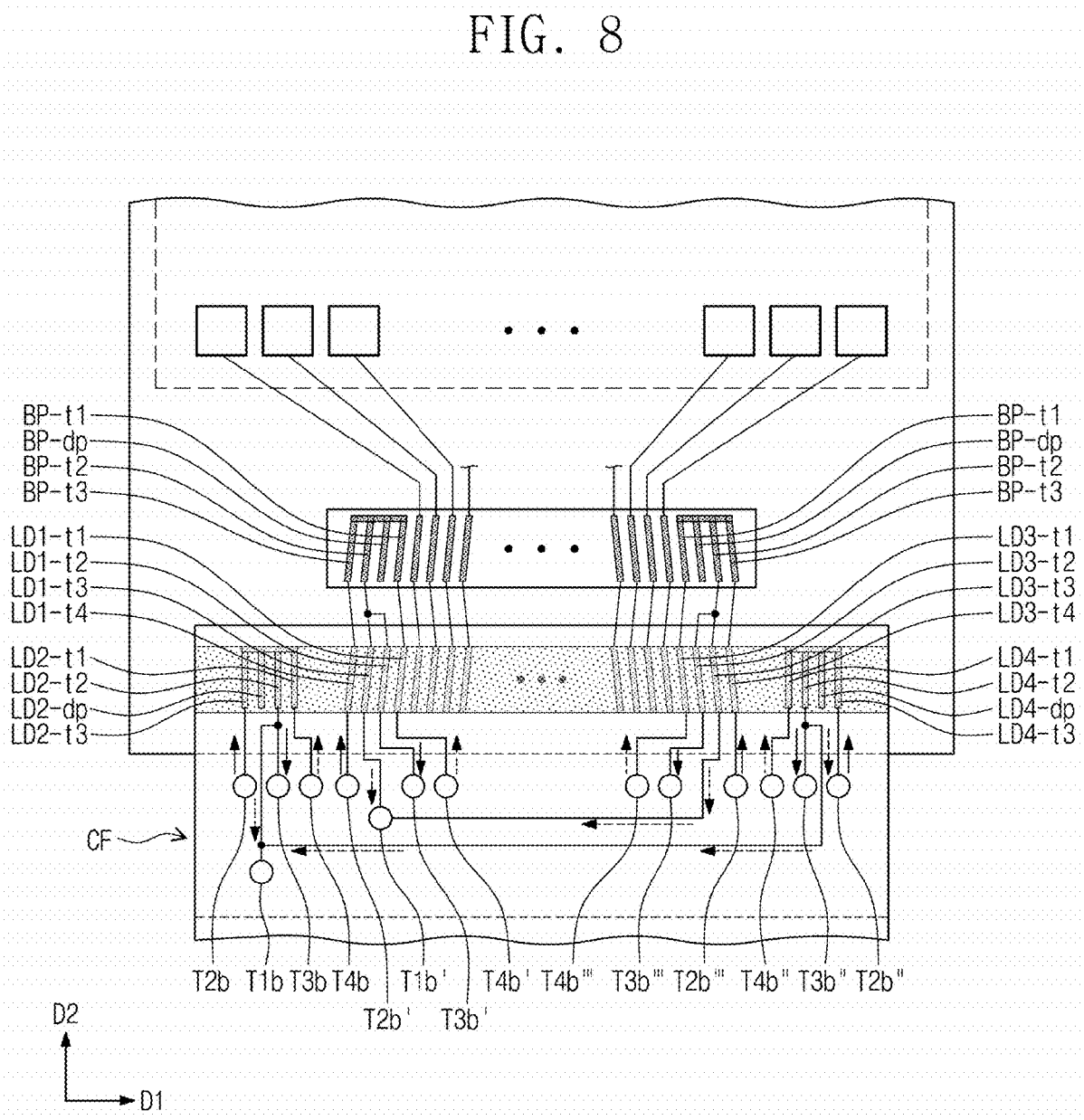
FIG. 8 is a plan view illustrating a connection structure between a lead part and terminals according to an embodiment of the disclosure.
Figure 9:
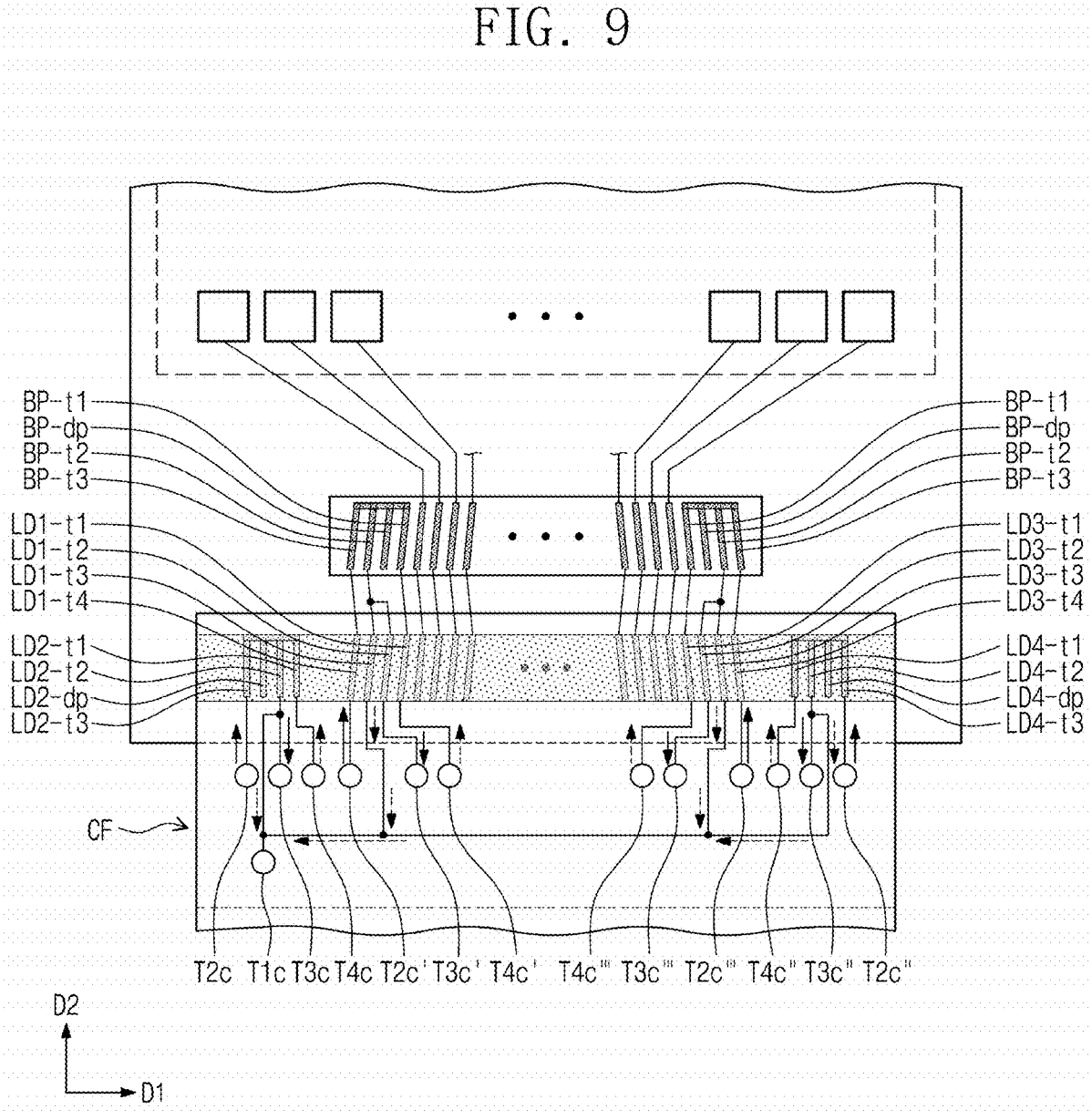
FIG. 9 is a plan view illustrating a connection structure between a lead part and terminals according to an embodiment of the disclosure.

FIG. 6 is a plan view illustrating a connection structure for connection between the lead parts LD and the terminals according to an embodiment of the disclosure, and FIGS. 7 to 9 are plan views illustrating connection structures for connection between the lead parts LD and terminals according to other embodiments of the disclosure.

FIG. 6 corresponds to the plan view (see FIG. 3) in which the circuit board CF, the driving circuit DV, and the electronic panel EP are combined. Duplicated descriptions of the same components as those described with reference to FIGS. 2A to 5 will not be given.

Referring to FIG. 6, a first terminal T1, a second terminal T2', a third terminal T3', and a fourth terminal T4' connected to the test leads of the first test lead group LD1-$t$ are illustrated, and the first terminal T1, a second terminal T2, a third terminal T3, and a fourth terminal T4 connected to the test leads of the second test lead group LD2-$t$ are illustrated.

Also, a first terminal T1", a second terminal T2'", a third terminal T3'", and a fourth terminal T4'" connected to the test leads of the third test lead group LD3-$t$ are illustrated, and the first terminal T1", a second terminal T2", a third terminal T3", and a fourth terminal T4" connected to the test leads of the fourth test lead group LD4-$t$ are illustrated.

The first terminal T1 connected to a test lead of the first test lead group LD1-*t* and the first terminal T1 connected to a test lead of the second test lead group LD2-*t* may be the same terminal. Since the first terminal T1 connected to a test lead of the first test lead group LD1-*t* and the first terminal T1 connected to a test lead of the second test lead group LD2-*t* are configured as the same terminal, the number of terminals disposed on the circuit board CF may be reduced. Through this, space utilization of other components in the circuit board CF may be increased, and the circuit board CF may be reduced in size. The first terminal T1 may be a ground terminal.

Similarly, the first terminal T1" connected to a test lead of the third test lead group LD3-*t* and the first terminal T1" connected to a test lead of the fourth test lead group LD4-*t* may be the same terminal. The first terminal T1" may be a ground terminal.

A connection resistance measurement method for detecting a connection failure will be described below. The connection resistance measurement method described below is an example of an implementation method for detecting a connection failure, and the electronic apparatus EA of the embodiment of the disclosure may detect a connection failure using various other connection resistance measurement methods.

In case that a test current is applied through the second terminals T2' and T2''' to the first test lead group LD1-*t* and the third test lead group LD3-*t*, the test current applied along the solid arrow may flow to the first terminals T1 and T1" via: the fourth leads LD1-*t*4 and LD3-*t*4 of the first and third test lead groups LD1-*t* and LD3-*t* connected to the second terminals T2" and T2'; the fourth pad PD2-*t*4 of the second test pads PD2-*t* connected to the fourth leads LD1-*t*4 and LD3-*t*4 of the first and the third test lead group LD1-*t* and LD3-*t*; the third pad PD1-*t*3 of the first test pads PD1-*t* connected to the fourth pad PD2-*t*4 of the second test pads PD2-*t*; the third bump BP-t3 of the test bumps BP-t connected to the third pad PD1-*t*3 of the first test pads PD1-*t*; the second pad PD1-*t*2 of the first test pads PD1-*t* connected to the third pad PD1-*t*3 of the first test pads PD1-*t*; the third pad PD2-*t*3 of the second test pads PD2-*t* connected to the second pad PD1-*t*2 of the first test pads PD1-*t*; and the third leads LD1-*t*3 and LD3-*t*3 of the first and the third test lead group LD1-*t* and LD3-*t* connected to the third pad PD2-*t*3 of the second test pads PD2-*t*. The first terminals T1 and T1" may each be a ground terminal to which a ground voltage is applied.

A flow of current may be generated by the test voltage applied from the test terminals T4' and T4''' along the dotted arrows. The current generated by the test voltage may be output through the third terminal T3' and T3''' after flowing from the fourth terminals T4' and T4''' via: the first leads LD1-*t*1 and LD3-*t*1 of the first and third test lead groups LD1-*t* and LD3-*t* connected to the fourth terminals T4' and T4'''; the first pad PD2-*t*1 of the second test pads PD2-*t* connected to the first leads LD1-*t*1 and LD3-*t*1 of the first and the third test lead group LD1-*t* and LD3-*t*; the first pad PD1-*t*1 of the first test pads PD1-*t* connected to the first test pad PD2-*t*1 of the second test pads PD2-*t*; the first bump BP-t1 of the test bumps BP-t connected to the first pad PD1-*t*1 of the first test pads PD1-*t*; the second pad PD1-*t*2 of the first test pads PD1-*t* connected to the first pad PD1-*t*1 of the first test pads PD1-*t*; the second bump BP-t2 of the test bump BP-t connected to the second pad PD1-*t*2 of the first test pads PD1-*t*; the second pad PD2-*t*2 of the second test pads PD2-*t*; and the second leads LD1-*t*2 and LD3-*t*2 of the first and the third test lead group.

According to the disclosure, by applying a test current to the second terminals T2' and T2''' from the first test lead group LD1-*t* and the third test lead group LD3-*t*, and applying the test voltage to the fourth terminals T4' and T4''', it may be possible to measure the current at the first terminals T1 and T1" and the connection resistance between the test lead and the test pad measured at the third terminal T3' and T3''' and the connection resistance between the test bump BP-t and the test pad.

In case that a test current is applied from the second and fourth test lead groups LD2-*t* and LD4-*t* through the second terminals T2 and T2", the applied test current along the solid arrow may be output towards the first terminals T1, T1" after flowing through the seventh leads LD2-*t*3 and LD4-*t*3 of the second and the fourth test lead group LD2-*t* and LD4-*t* connected to the second terminals T2 and T2", through the seventh pad PD2-*t*'3 of the third test pad PD2-*t*' connected to the seventh leads LD2-*t*3 and LD4-*t*3, and through the sixth lead LD2-*t*2 and LD4-*t*2 of the second and the fourth test lead group LD2-*t* and LD4-*t* connected to the sixth pads PD2-*t*'2 of the third test pads PD2-*t*'. For example, the test current may flow from the second terminals T2 and T2" to the first terminal T1 and T1" via the seventh leads LD2-*t*3 and LD4-*t*3, the seventh pad PD2-*t*'3, the sixth pad PD2-*t*', and through the sixth leads LD2-*t*2 and LD4-*t*2. The first terminals T1 and T1" may be ground terminals to which a ground voltage is applied.

A current may flow along a dotted arrow due to the test voltage applied to the fourth terminals T4 and T4". The current generated by the test voltage may be output through the third terminal T3 and T3" after flowing from the fourth terminals T4 and T4" to the fifth lead LD2-*t*1 and LD4-*t*1 of the second and fourth test lead groups LD2-*t* and LD4-*t* connected to the fourth terminals T4' and T4''', through the fifth pad PD2-*t*'1 connected to the fifth lead LD2-*t*1 and LD4-*t*1, the sixth pad PD2-*t*'2, and through the sixth leads LD2-*t*2 and LD4-*t*2 of the second and fourth test lead groups LD2-*t* and LD4-*t* connected to the sixth pad PD2-*t*'2.

According to the disclosure, a test current may be applied from the second test lead group LD2-*t* and the fourth test lead group LD4-*t*, to the second terminals T2 and T2", and a test voltage may be applied to the fourth terminals T4 and T4", thus making it possible to measure the current at the first terminals T1 and T1" and the connection resistance between the test lead and the test pad at the third terminals T3 and T3".

In case that the measured connection resistance is equal to or less than a value (predetermined or selectable), it may be considered that the connection between the circuit board CF and the electronic panel EP has been stably made. In case that the measured connection resistance is equal to or more than a value (predetermined or selectable), it may not be considered that the connection between the circuit board CF and the electronic panel EP has been stably made.

In case that a ground voltage is applied to the first terminals T1 and T1", the connection resistance between the test lead and the test pad may be measured through voltage measured at the third terminals T3, T3', T3", T3''' using the current value of the first terminals T1 and T1" as a default value.

A test lead LD1-*t*3 of the first test lead group LD1-*t* and one test lead LD2-*t*2 of the second test lead group LD2-*t* may be connected simultaneously to one first terminal T1.

A test lead LD3-*t*3 of the third test lead group LD3-*t* and a test lead LD4-*t*2 of the fourth test lead group LD4-*t* may be connected simultaneously to the first terminal T1". A ground voltage may be applied to each of the first terminals T1 and T1".

According to the disclosure, by providing a ground voltage applied in common to the first and second test lead groups LD1-$t$ and LD2-$t$ through a single terminal, a ground voltage that may be a reference voltage may be uniformly applied to the first and the second test lead groups LD1-$t$ and LD2-$t$. This may also apply to the third and the fourth test lead groups LD3-$t$ and LD4-$t$.

Since the first and the second test lead groups LD1-$t$ and LD2-$t$ share a terminal for providing the same voltage, and the third and the fourth test lead groups LD3-$t$ and LD4-$t$ share a terminal for providing the same voltage, the number of terminals may be reduced, and the area occupied by the terminals may be reduced. Accordingly, since the area occupied by the circuit components including the terminals is reduced, the degree of freedom in arrangement of the circuit components may be increased and electrical interference between the circuit components may be prevented.

In an electronic apparatus EA according to another embodiment of the disclosure, which will be described below, a connection resistance may be measured in the same manner.

The arrangement relationship of first to fourth terminals is not limited to what is illustrated in the drawings, and may be disposed along the periphery of a circuit board CF as in FIG. 3, and is not limited to any one embodiment.

Referring to FIG. 7, a first terminal T1$a'$, a second terminal T2$a'$, a third terminal T3$a'$, and a fourth terminal T4$a'$ which are connected to test leads of a first test lead group LD1-$t$ are illustrated, and a first terminal T1$a$, a second terminal T2$a$, a third terminal T3$a$, and a fourth terminal T4$a$ which are connected to test leads of a second test lead group LD2-$t$ are illustrated.

Also, a first terminal T1$a'''$, a second terminal T2$a'''$, a third terminal T3$a'''$, and a fourth terminal T4$a'''$ which are connected to test leads of a third test lead group LD3-$t$ are illustrated, and the first terminal T1$a$, a second terminal T2$a''$, a third terminal T3$a''$, and a fourth terminal T4$a''$ which are connected to test leads of a fourth test lead group LD4-$t$ are illustrated.

Duplicated descriptions of the same components as those described above with reference to FIGS. 2 to 3 and FIG. 6 will not be given.

The first terminal T1$a$ connected to a test lead of the second test lead group LD2-$t$ and the first terminal T1$a$ connected to a test lead of the fourth test lead group LD4-$t$ may be the same terminal. Since the first terminal T1$a$ connected to a test lead of the second test lead group LD2-$t$ and the first terminal T1$a$ connected to a test lead of the fourth test lead group LD4-$t$ are configured as the same terminal, the number of terminals disposed on the circuit board CF may be reduced. Similarly, the first terminal T1$a$ may be a ground terminal.

A test lead LD2-$t2$ of the second test lead group LD2-$t$ and a test lead LD4-$t2$ of the fourth test lead group LD4-$t$ both may be connected simultaneously to the first terminal T1$a$. A ground voltage may be applied to the first terminal T1$a$.

According to the disclosure, since a ground voltage is applied in common to the second and the fourth test lead groups LD2-$t$ and LD4-$t$ through a single terminal, a ground voltage that may be the reference voltage may be uniformly applied to the second and the fourth test lead groups LD2-$t$ and LD4-$t$. Furthermore, since the second and the fourth test lead groups LD2-$t$ and LD4-$t$ share a terminal for providing the same voltage, the number of terminals may be reduced, and the area occupied by the terminals may be reduced. Accordingly, since the area occupied by the circuit components including the terminal is reduced, the degree of freedom in arrangement of the circuit components may be increased and electrical interference between the circuit components may be prevented.

Referring to FIG. 8, a first terminal T1$b'$, a second terminal T2$b'$, a third terminal T3$b'$, and a fourth terminal T4$b'$ which are connected to the test leads of the first test lead group LD1-$t$ are illustrated, and a first terminal T1$b$, a second terminal T2$b$, a third terminal T3$b$, and a fourth terminal T4$b$ which are connected to the test leads of a second test lead group LD2-$t$ are illustrated.

Also, the first terminal T1$b'$, the second terminal T2$b'''$, the third terminal T3$b'''$, and the fourth terminal T4$b'''$ which are connected to the test leads of the third test lead group LD3-$t$ are illustrated, and the first terminal T1$b$, the second terminal T2$b''$, a third terminal T3$b''$, and a fourth terminal T4$b''$ which are connected to the test leads of the fourth test lead group LD4-$t$ are illustrated.

The first terminal T1$b'$ connected to a test lead of the first test lead group LD1-$t$ and the first terminal T1$b'$ connected to a test lead of the third test lead group LD3-$t$ may be the same terminal. Since the first terminal T1$b'$ connected to a test lead of the first test lead group LD1-$t$ and the first terminal T1$b'$ connected to one test lead of the third test lead group LD3-$t$ are configured as the same terminal, the number of terminals disposed on the circuit board CF may be reduced.

Similarly, the first terminal T1$b$ connected to a test lead of the second test lead group LD2-$t$ and the first terminal T1$b$ connected to a test lead of the fourth test lead group LD4-$t$ may be the same terminal.

As in the previous embodiment, the first terminals T1$b$ and T1$b'$ may be ground terminals.

A test lead LD1-$t3$ of the first test lead group LD1-$t$ and a test lead LD3-$t3$ of the third test lead group LD3-$t$ may be simultaneously connected to the first terminal T1$b'$. A test lead LD2-$t2$ of the second test lead group LD2-$t$ and A test lead LD4-$t2$ of the fourth test lead group LD4-$t$ may be simultaneously connected to the first terminal T1$b$. A ground voltage may be applied to each of the first terminals T1$b$ and T1$b'$.

According to the disclosure, since a ground voltage applied in common to the first and the third test lead groups LD1-$t$ and LD3-$t$ is provided through a single terminal, and a ground voltage applied in common to the second and the fourth test lead groups LD2-$t$ and LD4-$t$ is provided through a single terminal, the ground voltage that may be a reference voltage may be uniformly applied to each of the first and the third test lead group and the second and the fourth test lead group. By sharing a terminal for providing the same voltage to each of the test lead groups LD1-$t$, LD2-$t$, LD3-$t$, and LD4-$t$, the number of terminals may be reduced, and the area occupied by the terminals may be reduced. Accordingly, since the area occupied by the circuit components including the terminal is reduced, the degree of freedom in arrangement of the circuit components may be increased and electrical interference between the circuit components may be prevented.

Referring to FIG. 9, a first terminal T1$c$, a second terminal T2$c'$, a third terminal T3$c'$, and a fourth terminal T4$c'$ which are connected to the test leads of the first test lead group LD1-$t$ are illustrated, and the first terminal T1$c$, a second terminal T2$c$, a third terminal T3$c$, and a fourth terminal T4$c$ which are connected to the test leads of the second test lead group LD2-$t$ are illustrated.

Also, the first terminal T1$c$, a second terminal T2$c'''$, a third terminal T3$c'''$, and a fourth terminal T4$c'''$ which are connected to the test leads of the third test lead group LD3-$t$ are illustrated, and the first terminal T1$c$, a second terminal T2$c''$, a third terminal T3$c''$, and a fourth terminal T4$c''$ which are connected to the test leads of the fourth test lead group LD4-$t$ are illustrated.

A test lead LD1-$t$3 of the first test lead group LD1-$t$, a test lead LD2-$t$2 of the second test lead group LD2-$t$, a test lead LD3-$t$3 of the third test lead group LD3-$t$, and a test lead LD4-$t$2 of the fourth test lead group LD4-$t$ may be simultaneously connected to one first terminal T1$c$. A ground voltage may be applied to the first terminal T1$c$.

According to the disclosure, since a ground voltage applied in common to the first to fourth test lead groups LD1-$t$, LD2-$t$, LD3-$t$, and LD4-$t$ is provided through a single terminal, the ground voltage which may be a reference voltage may be uniformly applied to the first to fourth test lead groups LD1-$t$, LD2-$t$, LD3-$t$, and LD4-$t$. By sharing a terminal for providing the same voltage to each of the test lead groups LD1-$t$, LD2-$t$, LD3-$t$, and LD4-$t$, the number of terminals may be reduced, and the area occupied by the terminals may be reduced. Accordingly, since the area occupied by the circuit components including the terminal is reduced, the degree of freedom in arrangement of the circuit components may be increased and electrical interference between the circuit components may be prevented.

An electronic apparatus according to an embodiment of the disclosure may reduce the number of terminals for measuring a connection resistance of an electronic panel.

An electronic apparatus according to an embodiment of the disclosure may measure connection resistances at multiple points using fewer terminals.

An electronic apparatus according to an embodiment of the disclosure may reduce the size of a circuit board by reducing the area occupied by terminals in the circuit board.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments.

What is claimed is:

1. An electronic apparatus comprising:
an electronic panel including a first pad part and a second pad part having a portion electrically connected to the first pad part;
a driving circuit including a bump part overlapping the first pad part in a plan view; and
a circuit board including a lead part overlapping the second pad part in a plan view, wherein
the lead part comprising a plurality of test leads includes:
a first test lead group electrically connected to the first pad part; and
a second test lead group insulated from the first pad part,
one test lead of the first test lead group and one test lead of the second test lead group are electrically connected to each other,
the circuit board comprises a plurality of terminals electrically connected to the plurality of test leads, the plurality of terminals include a first terminal receiving a ground voltage, and
the one test lead of the first test lead group and the one test lead of the second test lead group are electrically connected to the first terminal.

2. The electronic apparatus of claim 1, wherein the plurality of terminals further include a second terminal electrically connected to each of the one test lead of the first test lead group and the one test lead of the second test lead group.

3. The electronic apparatus of claim 1, wherein the plurality of terminals are disposed along a periphery of the circuit board.

4. The electronic apparatus of claim 1, wherein the plurality of terminals are disposed adjacent to an end of the electronic panel.

5. The electronic apparatus of claim 1, further comprising:
a conductive adhesive member electrically connecting the electronic panel and the driving circuit or the electronic panel and the circuit board.

6. The electronic apparatus of claim 1, wherein
the electronic panel comprises:
a base substrate in which a display area, a first area, and a second area spaced apart from each other are defined; and
a plurality of pixels disposed in the display area,
the first pad part comprises:
a plurality of first effective pads disposed in the first area and electrically connected to the plurality of pixels; and
a plurality of first test pads insulated from the plurality of first effective pads,
the second pad part comprises:
a plurality of second effective pads disposed in the second area and electrically connected to the plurality of first effective pads;
a plurality of second test pads electrically connected to the plurality of first test pads; and
a plurality of third test pads insulated from the plurality of first test pads, and
the bump part comprises:
a plurality of effective bumps electrically connected to the plurality of first effective pads; and
a plurality of test bumps electrically connected to the plurality of first test pads.

7. The electronic apparatus of claim 6, wherein
the lead part further includes a plurality of effective leads electrically connected to the plurality of second effective pads,
the first test lead group is electrically connected to the plurality of second test pads, and
the second test lead group is electrically connected to the plurality of third test pads.

8. The electronic apparatus of claim 7, wherein
the circuit board comprises a plurality of terminals electrically connected to the plurality of test leads,
the plurality of terminals include a first terminal receiving a ground voltage, and
the one test lead of the first test lead group and the one test lead of the second test lead group are electrically connected to the first terminal.

9. The electronic apparatus of claim 8, wherein the plurality of terminals further include a second terminal electrically connected to the one test lead of the first test lead group and the one test lead of the second test lead group.

10. The electronic apparatus of claim 1, wherein the electronic panel is made of a glass or a plastic.

11. The electronic apparatus of claim 1, wherein the circuit board is a printed circuit board (PCB) or a flexible-printed circuit board (FPCB).

12. An electronic apparatus comprising:

an electronic panel including a first pad part and a second pad part having a portion electrically connected to the first pad part;

a driving circuit including a bump part overlapping the first pad part in a plan view; and a circuit board including a lead part overlapping the second pad part in a plan view, wherein the lead part comprising a plurality of test leads includes:

a first test lead group electrically connected to the first pad part; and a second test lead group insulated from the first pad part, one test lead of the first test lead group and one test lead of the second test lead group are electrically connected to each other the first pad part comprises N first test pads, the second pad part comprises N second test pads and N third test pads, the bump part comprises N test bumps, the first test lead group and the second test lead group each comprises N test leads, and N is a natural number greater than or equal to 3.

13. The electronic apparatus of claim 12, wherein the N second test pads and the N first test pads are electrically connected to each other.

14. The electronic apparatus of claim 12, wherein at least one of the N first test pads or the N third test pads includes a dummy pad.

15. The electronic apparatus of claim 14, wherein

N is 3, the N first test pads includes at least one dummy pad, and the N third test pads includes at least one dummy pad.

16. An electronic apparatus comprising:

an electronic panel including a first pad part and a second pad part having a portion electrically connected to the first pad part;

a driving circuit including a bump part overlapping the first pad part in a plan view;

a circuit board including a lead part overlapping the second pad part in a plan view; and a plurality of terminals electrically connected to a plurality of test leads, wherein the lead part comprises the plurality of test leads and includes:

a first test lead group and a third test lead group which are electrically connected to the first pad part and spaced apart from each other; and a second test lead group and a fourth test lead group which are insulated from the first pad part and spaced apart from each other, wherein one test lead of the second test lead group and one test lead of the fourth test lead group are electrically connected to each other, wherein the plurality of terminals include a first terminal receiving a ground voltage, and wherein at least two test leads selected from one test lead of the first test lead group, one test lead of the second test lead group, one test lead of the third test lead group, and at least one test lead of the fourth test lead group are electrically connected to the first terminal.

17. The electronic apparatus of claim 16, wherein the one test lead of the second test lead group and the one test lead of the fourth test lead group are electrically connected to the first terminal.

18. The electronic apparatus of claim 17, wherein one test lead of the first test lead group and one test lead of the third test lead group are electrically connected to each other.

19. The electronic apparatus of claim 18, wherein the one test lead of the first test lead group and the one test lead of the third test lead group are electrically connected to the first terminal.

* * * * *